United States Patent
Gregerson et al.

(10) Patent No.: US 10,723,525 B2
(45) Date of Patent: Jul. 28, 2020

(54) WAFER CONTAINER WITH LATCHING MECHANISM FOR LARGE DIAMETER WAFERS

(71) Applicant: ENTEGRIS, INC., Billerica, MA (US)

(72) Inventors: Barry Gregerson, Excelsior, MN (US); Matthew A. Fuller, Colorado Springs, CO (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 16/209,142

(22) Filed: Dec. 4, 2018

(65) Prior Publication Data

US 2019/0106249 A1   Apr. 11, 2019

Related U.S. Application Data

(63) Continuation of application No. 14/263,500, filed on Apr. 28, 2014, now Pat. No. 10,173,812.
(Continued)

(51) Int. Cl.
  *B65D 45/16*   (2006.01)
  *H01L 21/673*   (2006.01)
  *H01L 21/677*   (2006.01)

(52) U.S. Cl.
  CPC .......... *B65D 45/16* (2013.01); *H01L 21/6732* (2013.01); *H01L 21/6735* (2013.01);
  (Continued)

(58) Field of Classification Search
  USPC .......................................... 206/454, 710, 711
  See application file for complete search history.

(56) References Cited

U.S. PATENT DOCUMENTS 2,660,465 A  *  11/1953  Gerson ................... E05C 19/04
                                                              292/75
3,080,053 A  *   3/1963  Bicknell .................. B07C 5/08
                                                              209/560
(Continued)

FOREIGN PATENT DOCUMENTS

CN              1615388              5/2005
CN            105993067             10/2016
(Continued)

OTHER PUBLICATIONS

Supplemental European Search Report from EP Application 14787423.4, dated Oct. 27, 2016, 5 pages.

*Primary Examiner* — Kristina R Fulton
*Assistant Examiner* — Thomas L Neubauer
(74) *Attorney, Agent, or Firm* — Entegris, Inc.

(57) ABSTRACT

A wafer container with a latch mechanism that provides sealing for large wafer containers, such as for 450 mm wafers, accomplishes secure door closing and latching with reduced torque requirements for rotating the central rotatable cam plate. In various embodiments, a camming slot formed in the rotatable cammed plate is arcuate and defined by opposing cam surfaces which are selectively engaged by a cam follower, such as a roller, attached to a proximal end of a latch arm. The roller can include unitary axle portions that snap into the proximal end of the latch arm and is supported at both axial ends of the roller. The proximal end of the latch arm can include parallel extensions separated by a gap, and have guide in surfaces to deflect the extensions as the axle portions of the roller are forced into position thereby seating the roller at both axial ends.

11 Claims, 9 Drawing Sheets

Related U.S. Application Data

(60) Provisional application No. 61/818,343, filed on May 1, 2013, provisional application No. 61/816,576, filed on Apr. 26, 2013.

(52) U.S. Cl.
CPC .. *H01L 21/67373* (2013.01); *H01L 21/67376* (2013.01); *H01L 21/67386* (2013.01); *H01L 21/67769* (2013.01)

(56) References Cited

U.S. PATENT DOCUMENTS

| | | | |
|---|---|---|---|
| 3,191,280 A * | 6/1965 | Hill | H01L 21/67121 29/25.01 |
| 3,695,501 A * | 10/1972 | Radobenko | H01L 21/67144 228/4.5 |
| 5,711,427 A | 1/1998 | Nyseth | |
| 5,740,845 A | 4/1998 | Bonora et al. | |
| 5,915,562 A | 6/1999 | Nyseth et al. | |
| 5,931,512 A | 8/1999 | Fan et al. | |
| 5,957,292 A | 9/1999 | Mikkelsen et al. | |
| 6,105,782 A | 8/2000 | Fujimori et al. | |
| 6,326,614 B1 | 12/2001 | Bacchi et al. | |
| 6,457,598 B1 * | 10/2002 | Hsieh | H01L 21/67373 206/1.5 |
| 6,464,081 B2 | 10/2002 | Nyseth et al. | |
| RE38,221 E | 8/2003 | Gregerson et al. | |
| 6,623,051 B2 | 9/2003 | Bonora | |
| 6,902,063 B2 | 6/2005 | Pai et al. | |
| 7,344,031 B2 | 3/2008 | Hasegawa et al. | |
| RE40,513 E | 9/2008 | Krampotich et al. | |
| 7,422,107 B2 | 9/2008 | Burns et al. | |
| 7,549,552 B2 | 6/2009 | Hasegawa et al. | |
| 7,674,083 B2 | 3/2010 | Miyajima et al. | |
| 7,677,393 B2 | 3/2010 | Burns et al. | |
| 7,828,341 B2 | 11/2010 | Hasegawa et al. | |
| 7,909,166 B2 | 3/2011 | Lin | |
| RE42,402 E | 5/2011 | Gregerson et al. | |
| 8,196,748 B2 | 6/2012 | Chiu et al. | |
| 8,231,005 B2 * | 7/2012 | Kolbow | G03F 1/66 206/710 |
| 8,276,759 B2 | 10/2012 | Bores et al. | |
| 8,469,408 B2 | 6/2013 | Li | |
| 2004/0040884 A1 | 3/2004 | Pai et al. | |
| 2007/0108095 A1 | 5/2007 | Burns et al. | |
| 2010/0038281 A1 | 2/2010 | Lin | |

FOREIGN PATENT DOCUMENTS

| | | |
|---|---|---|
| JP | 2004-104062 | 4/2004 |
| JP | 2007-19328 | 1/2007 |
| JP | 2007-019328 A | 1/2007 |
| JP | 2013-4852 | 1/2013 |
| JP | 2013-004852 A | 1/2013 |

* cited by examiner

WAFER CONTAINER WITH LATCHING MECHANISM FOR LARGE DIAMETER WAFERS

RELATED APPLICATIONS

This application is a continuation of U.S. application Ser. No. 14/263,500, filed Apr. 28, 2014, which claims the benefit of U.S. Provisional Patent Application No. 61/816,576, filed Apr. 26, 2013, and U.S. Provisional Patent Application No. 61/818,343, filed on May 1, 2013, the disclosures of which are hereby incorporated by reference herein in their entirety.

FIELD OF THE DISCLOSURE

This disclosure relates generally to semiconductor wafer containers, and more specifically to latching mechanisms for wafer containers.

BACKGROUND OF THE DISCLOSURE

Processing of semi-conductor wafers into finished electronic components typically requires many processing steps where the wafers must be handled and processed. The wafers are very valuable, are extremely delicate, and are easily damaged by physical and electrical shocks. In addition, successful processing requires the utmost in cleanliness, free of particulates and other contaminants. As a result, specialized containers or carriers have been developed for use during processing, handling and transport of wafers. These containers protect the wafers from physical and electrical hazards, and are sealable to protect the wafers from contaminants. It is important that the containers remain sealed when in use to prevent damage to the wafers from contaminants. It is also important from a process efficiency standpoint that carriers be easily useable and cleanable.

Also, assembly processes should be as simple as possible and involve as few components as possible. Moreover it is desirable to eliminate or minimize any metallic components in the carriers and in particular the components of the latching mechanism.

The size of wafers being processed is increasing. Although processing of J 50 mm wafers and smaller is still implemented, there is now a significant presence of fabrication facilities that handle 300 mm wafers. The 300 mm wafer containers deal with problems unforeseen in the containers for smaller wafers. An entire new genre of wafer containers were developed for handling the 300 mm wafers, see for example: U.S. Pat. Nos. 8,276,759; RE38221; RE42402; RE40513; 7,422,107; 7,677,393; and 6,464,081, all of which are owned by the applicant and all hereby incorporated by reference herein except for express definitions and patent claims contained therein. The basic configuration is a front opening container that has a door that fits into a door frame defining the door opening. In an x-y-z coordinate system (FIG. 1), the wafers are inserted and removed in along the y coordinate, upward and downward are along the z coordinate, and left and right are along the x coordinate. The door is inserted in a y direction and has latch tips that move along the y coordinate and then the z coordinate to both latch and pull in the door toward the container portion to constrain wafers and provide sealing between the door and container portion.

Presently, 450 mm fabrication facilities are being developed and the containers for same are also proceeding with further and different performance and functionality enhancements beyond prior art containers. Such containers can have a similar configuration of the front opening door.

Wafer containers for 150 mm and 300 mm provide various configurations of door enclosures and latching mechanisms. Many or most known latching mechanisms for 300 mm wafer containers use rotary members with robotic interfaces for actuating the latch. Typically rotatable plates include cam surfaces and a link or links with a cam follower to engage the rotatable plate. The opposite ends of the links will have or be connected to latching tips that engage with the door frames in the container portions. Latching mechanisms with components that engage and rub against other components can generate particles which are inimical to wafer processing.

In containers for larger wafers, particularly 450 mm wafers, forces are required to secure the wafers in place (i.e., forces are exerted on the forward and rear wafer cushions or restraints positioned on the door and rear of the containers are required to provide greater securement forces). Moreover, substantially more gasket length is associated with the door on the 450 mm compared to the 300 mm door. The gasket has to be compressed for sealing and the greater length directly correlates with increased closure force requirements. With these greater forces, door latching becomes more difficult. In addition to securing the door in the door frame, the latching mechanism moves the door towards the interior of the container capturing and resiliently restraining the wafers between the resilient cushions on the inside surface of the door and the rearward wafer engagement and compressing the gasket. Such capturing and sealing requires deflection of the resilient wafer cushions and compression of the gasket. The doors accomplish latching typically by automated robotic means turning robotic latch keys in key holes in the latch plates.

The required increased wafer restraint forces and gasket sealing forces with bigger doors generates higher stresses on components as well as greater frictional forces between engaged rubbing components. All this causes greater torque requirements to actuate the door closings and associated greater particulation issues between rubbing or sliding components. Industry standards and/or customer requirements dictate the forces available to accomplish the rotation for latching doors. Conventionally configured latches used for 300 mm containers and smaller do not appear to be ideally suited for the use in the larger 450 mm containers due to the additional demands discussed above.

A rotatable latching member that pivots at the periphery of the door is known such as by U.S. Pat. No. 6,457,598 as well as a single internal slot connected to latch arm. Such arrangements as illustrated are not believed provide the reduced torque requirements as needed for 450 mm wafer containers.

Conventional rotatable plates have used slots with cam followers that have sliding surfaces that engage a slot in the plate to move the linkage to accomplish the required two dimensional motion of the latch tips. It is desirable in the mechanisms to have motions that are well defined and smooth operating to prevent jams or rough operations which can lead to particle generation or ineffective or inconsistent performance. Peripheral edge engagement of a cam plate by a roller cam follower in a wafer container door mechanism is known but requires a spring to maintain engagement between the roller and cam surface of the cammed plate. It is also highly desirable to have mechanisms of minimal numbers of components, easily assembled with no or minimal tools, or robotically, and that are readily cleaned.

SUMMARY OF THE DISCLOSURE

Various embodiments disclosed herein present a wafer container with a latch mechanism that provides sealing for large wafer containers, such as for 450 mm wafers, and accomplishes secure door closing and latching with reduced torque requirements for rotating the central rotatable cam plate.

In one embodiment, a latch arm that supports a cam follower at both axial ends thereof. This enhances the stability of the cam follower and the structural integrity of the coupling between the cam follower and the latch arm.

Furthermore, for embodiments that incorporate a roller into the cam follower, the diameter of the axle of the roller should be substantially smaller than the outer diameter of the roller. As the diameter of the axle approaches the outer diameter of the cam follower, the tendency of the roller to bind increases. The binding of the roller causes sliding engagement with the cam follower rather than a rolling engagement, which leads to mechanical inefficiencies. Thus, in order to benefit from the use of a roller, a smaller axle diameter is preferred over a larger axle diameter, which inherently weakens the axle. For the increased forces required of larger class wafer carriers, the weakened axles that accompany efficiently operating rollers is antithetical. By supporting the roller axle on both ends, it is possible to utilize roller axles having smaller diameters relative to conventional rollers that are supported only on one end. The smaller axle diameters enhance the performance of the roller, the roller being less prone to binding on the axle than with larger diameter axles.

In various embodiments, tracking and alignment structures maintain alignment between the components for enhanced efficiency in the motion translation portions, going from rotation at the plate with the key slot to linear movement at the latch arm, to rotation and latching by the pivoting latching member at the door periphery.

In certain embodiments, a slot in the rotatable cammed plate is arcuate and is defined by opposing cam surfaces which are engaged by a roller attached to a first or proximal end of a latch arm. The opposite distal end is connected to a pivoting latching member that, as the cammed plate is rotated, the cam surfaces manipulate the cam follower. The latch arm is thereby translated inwardly and outwardly, with respect to the rotatable cammed plate and translates the motion to rotation of the latching members with latching tips extending outwardly from the door periphery and then pulling the door inwardly. The roller may have unitary axle portions that snap into the proximal end of the latch arm. The proximal end can define a "forked" configuration having two extension members that define a gap therebetween, and have guide in surfaces to deflect the parallel extension members as the axle portions of the roller are forced into position thereby allowing the roller to be seated. The slot is sized to have the roller engage the opposing cam surfaces on each respective side of the slot without introducing into or at least restricting the "play" of the mechanism (i.e., motion by the roller in the slot in the direction that the linkage can move, without corresponding rotation of the rotatable cammed plate). In some embodiments, the play less than 0.375 inches. In certain embodiments, the play less than 0.25 inches, and, in various embodiments, less than 0.20 inches. In various embodiments, the space between the opposing cam surfaces defining the slot is less than or equal to 1.3 times the diameter of the engagement portion of the cam roller. In some embodiments, the space between the opposing cam surfaces defining the slot is less than or equal to 1.2 times the diameter of the engagement portion of the cam roller; in certain embodiments, less than or equal to 1.15 and 1.10 times, respectively, the diameter of the engagement portion of the cam roller.

In various embodiments of the disclosure, the linkages are secured in alignment for efficient use of power in motion translation from the rotation of the rotatable cammed latch plate to the linkage and to the rotation of the latch member with the latch tips. Such alignment can be provided by the inside surface of the base of the door enclosure, the inside surface of the cover of the door enclosure, internal posts in slots in the linkages. Also, alignment can be provided by cooperating, complementary non parallel engagement surfaces on the cam surfaces and the roller. For example, the roller can have central circumferential protruding portion, such as a rib, that engages concave cam surfaces defining the slot of the rotatable cammed member.

In some embodiments, the roller can have an inset, i.e., a concave engagement surface to interface with a convex, peripheral face of the rotatable cammed plate. These cooperating, complementary surfaces provide alignment consistent with other constraints.

In some embodiments of the disclosure, a cammed wheel includes opposing cam surfaces, one that has a wider cam surface to accommodate greater forces, specifically the closing compressive forces required to push the latch arm out rotating the latching member to the latching position. The force requirements of the opposite side of the slot that pulls the latch arm away from the door periphery when the latch mechanism is unlatched tend to require less force and therefore less bearing surface. In one embodiment the or wider (thicker in thickness) cam surface is 2 times as wide as the other, narrower (thinner in thickness), cam surface; in other embodiments 2.5 times as wide; in some embodiments 3 times as wide; in other embodiment 5 times as wide. The narrower cam surface can be 1.5 mm to 3 mm in one embodiment. The wider cam surface can be 4 to 12 mm in width. In various embodiments, the wider cam surface can be between 1 mm wider and 5 mm wider (inclusive) than the narrower cam surface. In one embodiment the wider cam surface is 3 mm wider than the narrower cam surface. The narrower cam surface is opposite the wider cam surface.

In one embodiment, the cam and cam surface are positioned so that a lineal contact between the cross-sectional profiles of the mating components is less than about 2 mm is provided, which promotes long component life, mitigates particle generation, and is easy to manufacture.

Structurally, in various embodiments, a door latching mechanism for a wafer container is disclosed, comprising a cammed plate including a first face, a second face opposite the first face, and an outer perimeter, the cammed plate being rotatable about a central axis that is substantially perpendicular to the first face and the second face. The cammed plate further defines an arcuate camming slot that passes through the first face and the second face, the arcuate camming slot being bound by an inner perimeter having a first cam surface. A cam follower is disposed within the camming slot, the cam follower being engageable with the first cam surface. A latch arm is translatable along an actuation axis and includes a proximal end having a first extension and a second extension, each extending in a direction parallel to the actuation axis. The first extension and the second extension each extend over the outer perimeter of the cammed plate so that the first extension is adjacent the first face of the cammed plate and the second extension is adjacent the second face of the cammed plate. The cam follower is coupled to the first extension and the second extension. When the cammed plate is rotated about the central axis, the first cam surface engages the cam follower to exert a force on the first extension and the second extension of the latch arm along the actuation axis.

In one embodiment, the camming slot of the cammed plate further comprises a second cam surface that is opposite the first cam surface, the cam follower being selectively engageable with the first cam surface and the second cam surface. When the cammed plate is rotated about the central axis in a second rotational direction that is opposite the first rotational direction, the second cam surface engages the cam follower to exert a force on the first extension and the second extension of the latch arm in a second translational direction along the actuation axis, the second translational direction being opposite the first translational direction. In one embodiment, the first cam surface and the second cam surface define a first width and a second width, respectively, extending in a direction parallel to the central axis, the first width being greater than the second width. For certain embodiments, a ridge extends from at least one of the first face and the second face of the cammed plate proximate the camming slot to extend the first cam surface in a direction parallel to the central axis. The first width of the first cam surface can be at least two times wider and less than or equal to five times wider than the second width of the second cam surface. In one embodiment, the first width of the first cam surface is in a range of 4 mm to 12 mm inclusive, and the second width of the second cam surface is in a range of 1.5 mm to 3 mm inclusive. In one embodiment, the first width of the first cam surface is at least 1 mm wider and less than or equal to 5 mm wider than the second width of the second cam surface. In some embodiments, the first width of the first cam surface is about 3 mm wider than the second width of the second cam surface.

The cam follower can comprise a roller that is rotatable about a rotational axis, the rotational axis being substantially parallel to the central axis. In one embodiment, the first cam surface defines a first cross-sectional profile in a plane normal to a direction of travel of the roller along the first cam surface, and an engaging surface of the roller defines a second cross-sectional profile in the plane normal to the direction of travel, wherein one of the first cross-sectional profile and the second cross-sectional profile is convex and the other of the first cross-sectional profile and the second cross-sectional profile is substantially planar. The one of the first cross-sectional profile and the second cross-sectional profile that is convex can define planar surfaces, and those planar surfaces can intersect to substantially define an apex.

In various embodiments, an engaging surface of the roller defines one of a convex cross-sectional profile and a concave cross-sectional profile in a plane normal to a direction of travel of the roller along the first cam surface. The first cam surface can define the other of the concave cross-sectional profile and the convex cross-sectional profile in the plane normal to the direction of travel of the roller along the first cam surface. The cross-sectional profile of the roller can be complementary to the cross-sectional profile of the first cam surface. The roller can comprise polyetheretherketone.

In one embodiment, the roller includes an engagement portion for selectively engaging one of the first cam surface and the second cam surface. The arcuate camming slot can be centered about an arcuate axis that lies on a rotation plane that is normal to the central axis, the arcuate camming slot defining a slot width dimension that is between the first cam surface and the second cam surface, the slot width dimension being normal to the arcuate axis on the rotation plane. In one embodiment, the slot width is at least 0.25 mm greater than an outer diameter of the engagement portion of the roller and less than or equal to 1.3 times the outer diameter of the engagement portion. Variously, the slot width can be less than or equal to 1.2 times or 1.1 times the outer diameter of the engagement portion.

For some embodiments, the roller includes a first face and a second face opposite the first face, the roller being rotatable about an axle having an axle diameter. The axle can extend in a direction perpendicular to the first face of the roller and the second face of the roller. The roller can include an engagement portion that extends radially outward from the rotational axis and have an outer diameter for engaging the first cam surface. The outer diameter of the engagement portion of the roller can be at least 2 times greater and less than or equal to 5 times greater than the axle diameter. In some embodiments, the axle is in the range of 20% to 40% inclusive of the roller diameter. Example and non-limiting dimensions for the axle and roller diameters are about 4 mm and about 14 mm, respectively.

In one embodiment, the axle is integrally formed (i.e., unitary) with the roller. In other embodiments, the axle is selected from a group consisting of a dowel pin, a rivet, a snap-in plug, and a shaft with retaining ring.

In various embodiments of the disclosure, a door latching mechanism for a wafer container is presented, comprising a cammed plate rotatable about a central axis and defining an arcuate camming slot, the arcuate camming slot being bound by an inner perimeter having a first cam surface and a second cam surface, the second cam surface being opposite the first cam surface. A cam follower is disposed within the camming slot and engageable with the inner perimeter, the cam follower being translatable along an actuation axis. A latch arm translatable along the actuation axis is operatively coupled to the cam follower. In one embodiment, rotation of the cammed plate about the central axis in a first rotational direction can cause the first cam surface to engage the cam follower and the second cam surface to disengage the cam follower during closure of the door latching mechanism. Also, rotation of the cammed plate about the central axis in a second rotational direction opposite the first rotational direction causes the first cam surface to disengage the cam follower and the second cam surface to engage the cam follower during opening of the door latching mechanism, so that the cam follower defines a closed loop route relative to the inner perimeter of the camming slot.

Optionally, the latch arm includes a proximal end having a first extension and a second extension that extend in a direction parallel to the actuation axis. The first extension and the second extension can define a gap therebetween. In one embodiment, the first extension and the second extension extending over an outer perimeter of the cammed plate so that a portion of the outer perimeter is disposed within the gap, the cam follower being coupled to the first extension and the second extension. In one embodiment, when the cammed plate is rotated about the central axis in the first rotational direction and the first cam surface engages the cam follower, a force is exerted on the first extension and the second extension of the latch arm in a first translational direction along the actuation axis; when the cammed plate is rotated about the central axis in the second rotational direction and the second cam surface engages the cam follower, a force is exerted on the first extension and the second extension of the latch arm in a second translational direction along the actuation axis, the second translational direction being opposite the first translational direction.

In various embodiments, a method for assembling a door latching mechanism for a wafer container is herein disclosed, comprising:

providing a cam follower including a first face and a second face opposite the first face, the cam follower including a first protruding portion that extends in a direction perpendicular to the first face of the cam follower and a second protruding portion that extends in a direction perpendicular to the second face of the cam follower, the cam follower including an engagement portion that extends radially outward from the rotational axis and having an outer diameter for engaging the first cam surface;

providing a latch arm including a proximal end having a first extension and a second extension that extend in a direction parallel to the actuation axis, the first extension and the second extension defining a gap therebetween, the first extension and the second extension each including mounting structure for securing a respective one of the first protruding portion and the second protruding portion of the cam follower thereto;

providing a cammed plate for rotation about a central axis and being centered about a rotation plane that is perpendicular to the central axis, the cammed plate defining an arcuate camming slot proximate an outer perimeter of the cammed plate, wherein a peripheral portion of the cammed plate located between the arcuate camming slot and the outer perimeter has a radial dimension and an axial dimension that are less than a dimension of the gap of the latch arm;

disposing the peripheral portion of the cammed plate within the gap of the latch arm;

after the step of disposing, orienting the latch arm so that the mounting structures of the first extension and the second extension are on the same side of the rotation plane; and after the step of orienting, affixing the cam follower to the first extension and the second extension of the latch arm.

The method can further comprise, after the step of affixing, rotating the latch arm about the peripheral portion and away from the central axis so that the latch arm is substantially parallel with the rotation plane. In some embodiments, at least one of the first extension and the second extension of the latch arm provided in the step of providing a latch arm includes a rounded end for pivoting the extension through the arcuate camming slot during the step of rotating. Also, the first protrusion and the second protrusion of the cam follower provided in the step of providing a cam follower can define an axle, the cam follower being rotatable about the axle.

In another embodiment, a method for assembling a door latching mechanism for a wafer container comprises:

providing a cam follower including a first face and a second face opposite the first face, the cam follower including a first protruding portion that extends in a direction perpendicular to the first face of the cam follower and a second protruding portion that extends in a direction perpendicular to the second face of the cam follower, the cam follower including an engagement portion that extends radially outward from the rotational axis and having an outer diameter for engaging the first cam surface;

providing a latch arm including a proximal end having a first extension and a second extension that extend in a direction parallel to the actuation axis, the first extension and the second extension defining a gap therebetween, the first extension and the second extension each including mounting structure for securing a respective one of the first protruding portion and the second protruding portion of the cam follower thereto;

providing a cammed plate for rotation about a central axis and being centered about a rotation plane that is perpendicular to the central axis, the cammed plate defining an arcuate camming slot proximate an outer perimeter of the cammed plate, wherein a peripheral portion of the cammed plate located between the arcuate camming slot and the outer perimeter has an axial dimension that is less than a dimension of the gap of the latch arm;

disposing a cam follower within the arcuate camming slot;

moving the first extension and the second extension toward cam follower disposed within the arcuate camming slot so that the peripheral portion of the cammed plate is within the gap of the latch arm; and affixing the cam follower to the first extension and the second extension of the latch arm so that the peripheral portion of the cammed plate is captured between the first extension, the second extension, and the cam follower.

For the various method embodiments, the first extension and the second extension of the latch arm provided in the step of providing a latch arm can include a mounting structure that snappingly engages the cam follower. The mounting structure of the first extension and the second extension of the latch arm provided in the step of providing a latch arm can include a ramp that causes the first extension and the second extension to deflect away from each other during the step of affixing, and wherein the step of affixing further comprises drawing the latch arm and the cam follower together along the actuation axis. Optionally, the mounting structure of at least one of the first extension and the second extension of the latch arm provided in the step of providing a latch arm includes a C-shaped snap-in that spreads lateral to the actuation axis when the cam follower is pressed therein, and the step of affixing further comprises drawing the latch arm and the cam follower together along the actuation axis.

Optionally, the mounting structure C-shaped snap-in of the mounting structure of at least one of the first extension and the second extension of the latch arm provided in the step of providing a latch arm includes a lead-in. The step of affixing further comprises drawing the latch arm and the cam follower together along the actuation axis.

Some embodiments of the disclosure are directed to a wafer container comprising a container portion and a door that fits into a door frame for sealingly closing the container portion. A latching mechanism includes a cammed plate rotatable about a central axis and defining an arcuate camming slot, the arcuate camming slot being bound by an inner perimeter having a first cam surface; a cam follower disposed within the camming slot and engageable with the inner perimeter, the cam follower being translatable along an actuation axis; and a latch arm translatable having a proximal end and a distal end arranged along the actuation axis and operatively coupled to the cam follower. The latch arm can include a first extension and a second extension at the proximal end that extend in a direction parallel to the actuation axis, the first extension and the second extension defining a gap therebetween. In one embodiment, the first extension and the second extension extend over an outer perimeter of the cammed plate so that a portion of the outer perimeter is disposed within the gap, the cam follower being coupled to the first extension and the second extension, the latch arm including a latching member operatively coupled to the distal end. When the cammed plate is rotated about the central axis, the first cam surface engages the cam follower to exert a force on the first extension and the second extension of the latch arm in a first direction along the actuation axis, causing the latching member to sealingly engage the door against the door frame.

Optionally, the arcuate camming slot of the cammed plate includes a second cam surface, the second cam surface being opposite the first cam surface. When the cammed plate is rotated about the central axis in a second rotational direction that is opposite the first rotational direction, the second cam surface engages the cam follower to exert a force on the first extension and the second extension of the latch arm in a second translational direction along the actuation axis, the second translational direction being opposite the first translational direction.

The above summary of the various representative aspects of the disclosed embodiments is not intended to describe each illustrated aspect or every implementation thereof. Rather, the aspects are chosen and described so that others skilled in the art can appreciate and understand the principles and practice of the disclosed devices and methods. The figures in the detailed description that follow more particularly exemplify these aspects.

Figure 1:
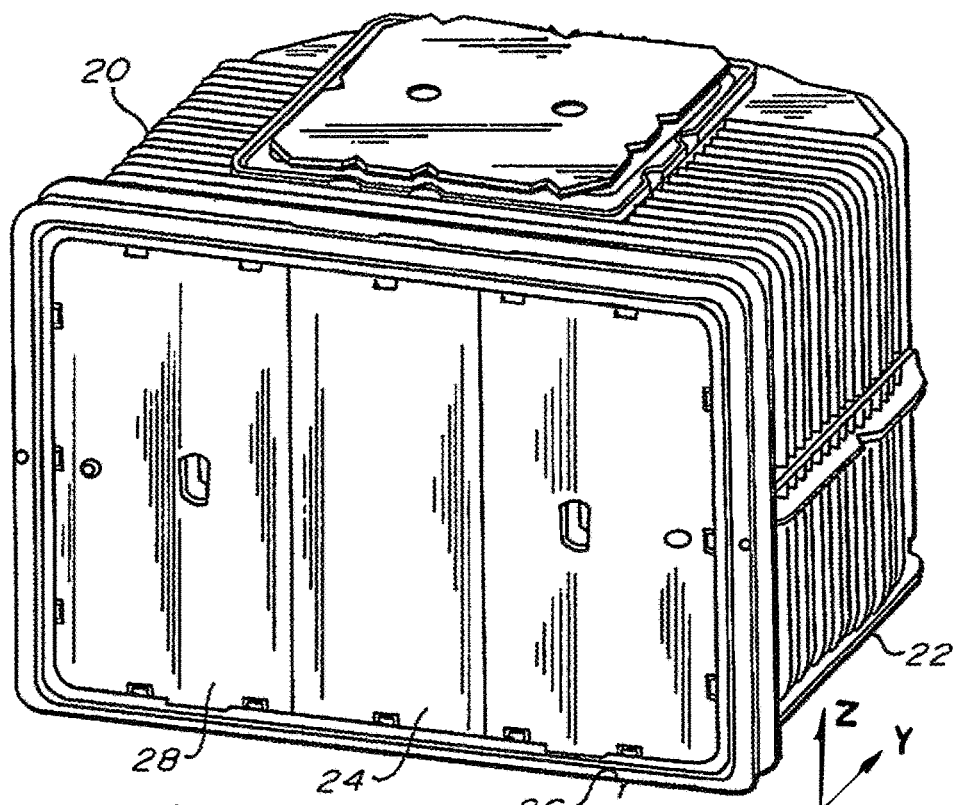
FIG. 1 is a perspective view of a large diameter wafer container in an embodiment of the disclosure.
Figure 2:
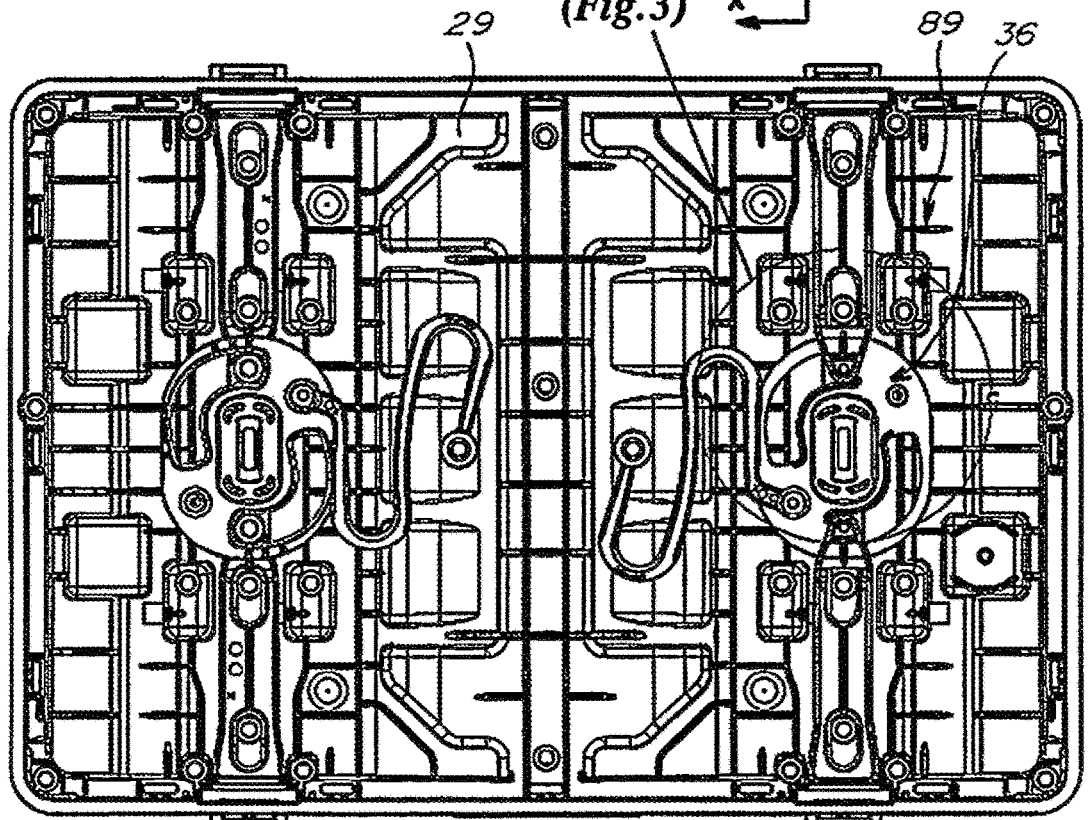
FIG. 2 is an elevation view of a door with the front cover removed of a large diameter wafer container in an embodiment of the disclosure.
Figure 3:
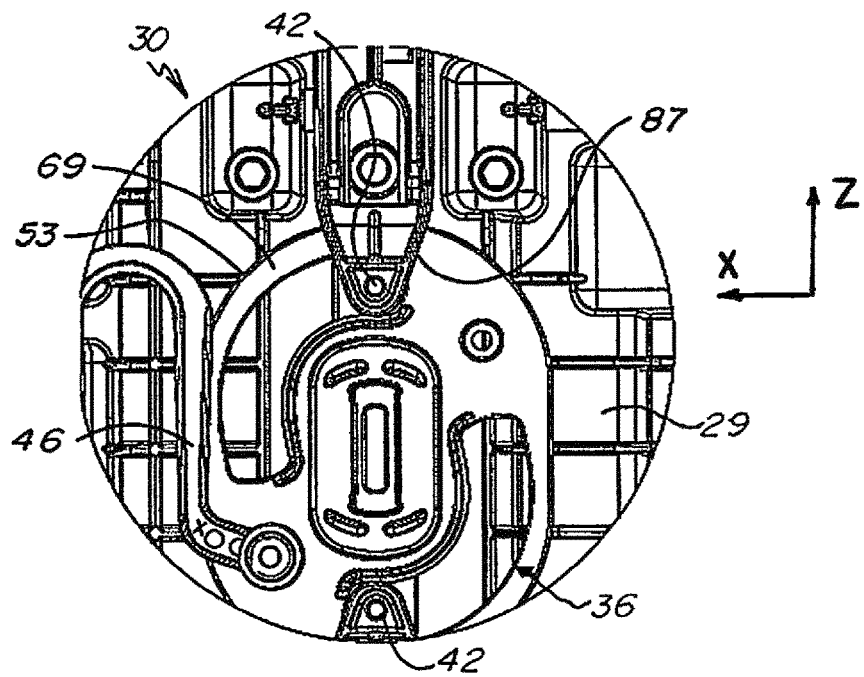
FIG. 3 is an enlarged elevation view of a rotatable cammed plate, spring and proximal portion of a latch arm of FIG. 2.
Figure 4:
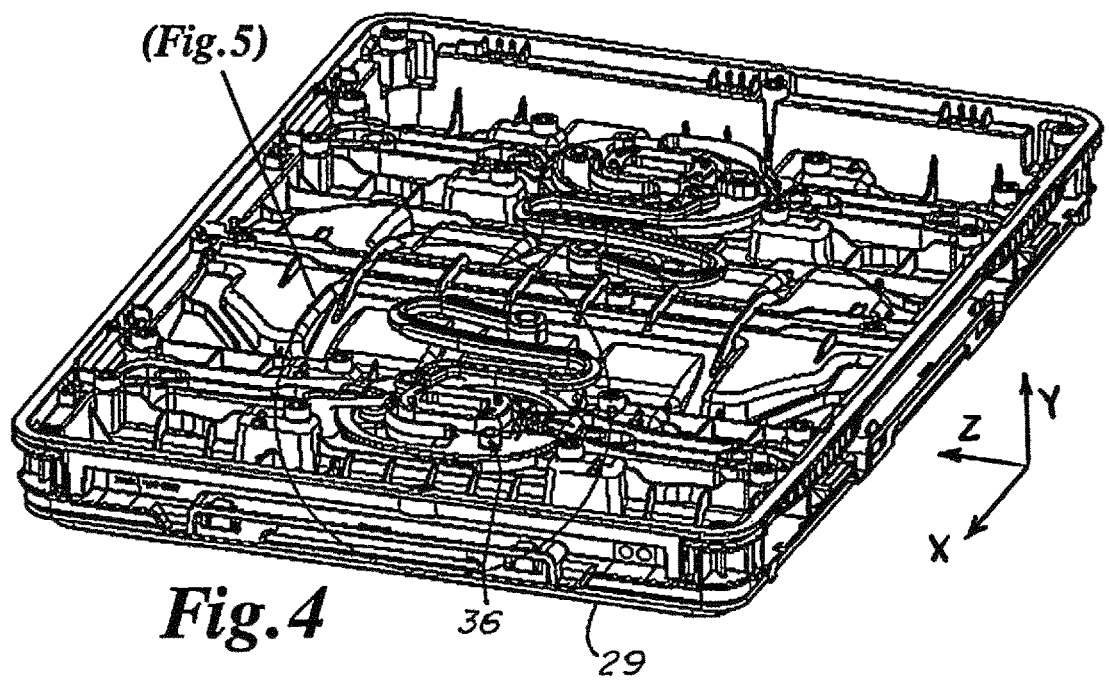
FIG. 4 is a perspective view of a door with the front cover removed of a large diameter wafer container in an embodiment of the disclosure.
Figure 5:
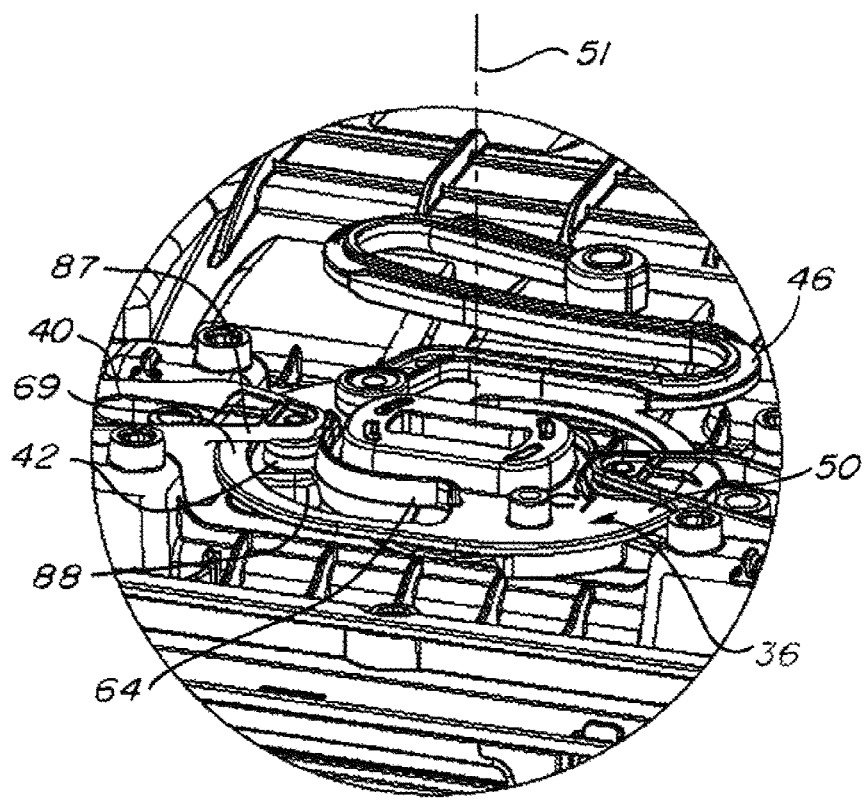
FIG. 5 is an enlarged detailed perspective view of the rotatable cammed plate, spring and proximal portion of FIG. 4.
Figure 6:
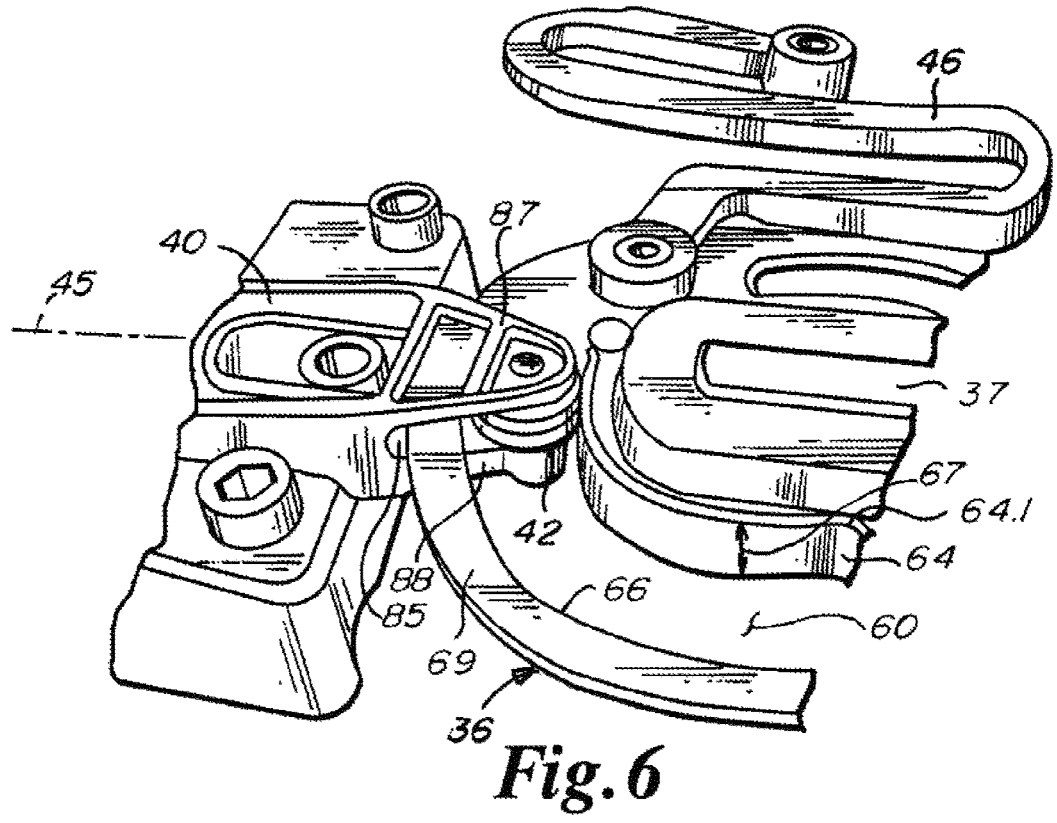
FIG. 6 is an enlarged, partial detailed perspective view of the rotatable cammed plate, spring and proximal portion of a latch arm in an embodiment of the disclosure.
Figure 7:
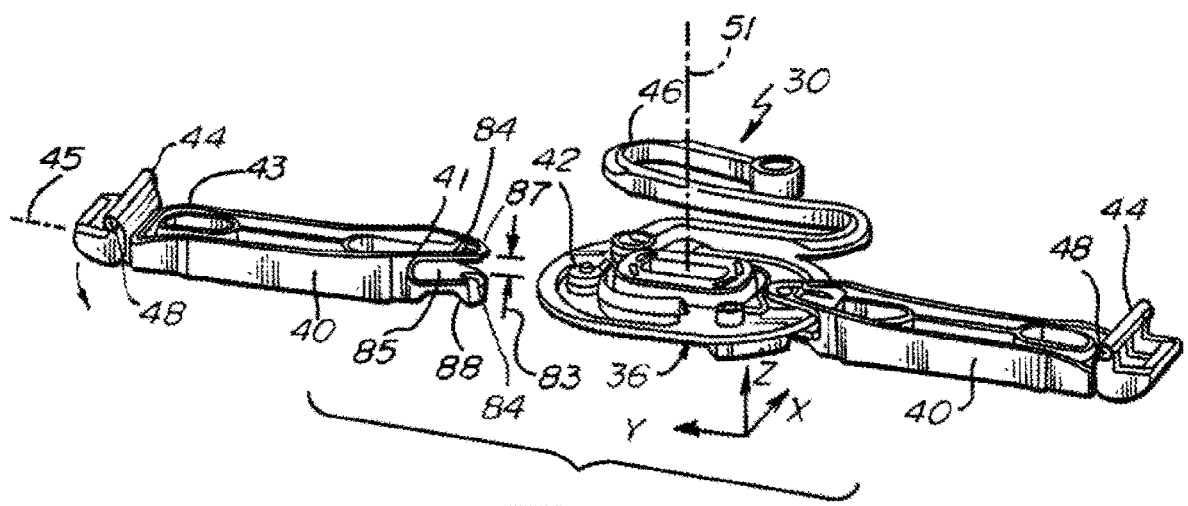
FIG. 7 is a perspective view of components of a latch mechanism in an embodiment of the disclosure.
Figure 8:
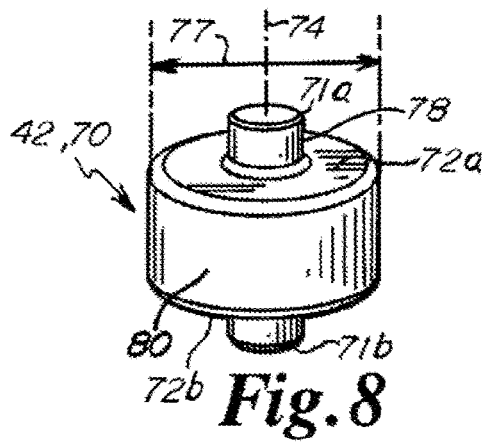
FIG. 8 is a perspective view of a cam follower or roller in an embodiment of the disclosure.
Figure 9:
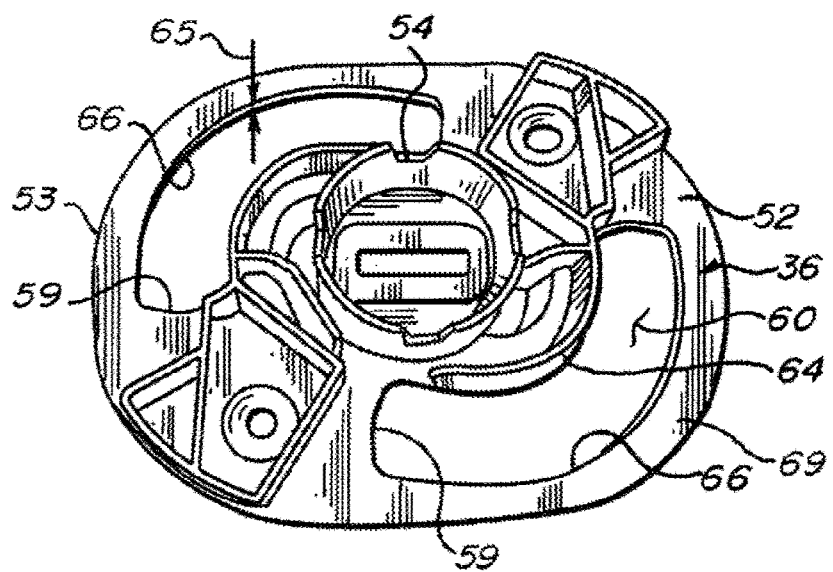
FIG. 9 is a detailed perspective view of a back face of a cammed plate in an embodiment of the disclosure.

While the present disclosure is amenable to various modifications and alternative forms, specifics thereof have been shown by way of example in the drawings and will be described in detail. It should be understood, however, that the particular aspects described are not intended to be limiting. On the contrary, the intention is to cover all modifications, equivalents, and alternatives falling within the spirit and scope of the disclosure as defined by the appended claims.

DETAILED DESCRIPTION

Referring to FIG. 1, a large diameter wafer container 20 is depicted in an embodiment of the disclosure. The wafer container 20 includes a container portion 22 and a door 24 that fits into a door frame 26 for sealingly closing the container and restraining wafers therein. A cover 28 and a base portion 29 of the door 24 combine to form an enclosure that contains latching mechanisms. In one embodiment, the wafer container 20 is suitable for 450 mm wafers.

Referring to FIGS. FIGS. 2 through 9, a latch mechanism 30 and various components thereof are depicted in assembly and in isolation in embodiments of the disclosure. The latch mechanism 30 is secured place within the door 24. The latch mechanism 30 comprises a cammed plate 36 operatively coupled with a link arm or latch arm 40 via a cam follower 42. In various embodiments, the latch arm 40 includes a proximal end 41 and a distal end 43 and defines an actuation axis 45 that passes through the proximal and distal ends 41 and 43. An over-center biasing spring 46 can be operatively coupled between the base portion 29 and the cammed plate 36.

In various embodiments, the proximal end 41 of the latch arm 40 includes two extension members 87, 88 that define a gap 85 having a normal dimension 83 therebetween and extending in a direction parallel to actuation axis 45. Each of the extension members 87 and 88 can include a mounting structure 84 for mounting the cam follower 42 thereto.

In various embodiments, the cam follower 42 includes opposing protrusions 71a and 71b for coupling to the mounting structures 84 of the latch arm 40. The protrusions 71a and 71b extend in a direction perpendicular to a first face 72a and a second face 72b, respectively, of the cam follower 42, the first face 72a being opposite the second face 72b. In certain embodiments, the cam follower 42 comprises a roller 70 rotatable about a roller axis 74, the roller 70 including an engagement portion 80 that extends radially outward from the roller axis 74 and having an outer diameter 77. In some embodiments, the protrusions 71a and 71b define an axle 78. In one embodiment, the axle 78 is integrally formed with the first and second faces 72a and 72b of the cam follower. In other embodiments, the axle 78 is formed separately from the roller 70 and extends through the roller 70 to protrude from both faces 72a and 72b of the cam follower 72. When separately formed from the roller 70, the axle 78 can comprise, for example, a dowel pin, a rivet, a snap-in plug, or a shaft with retaining ring.

A latching member 44 is operatively coupled with the distal end 43 of the latch arm 40. The latching member 44 can include an axle or pivot pin 48 that seat in slots or recesses in the base portion 29 of the door 24 and about which the latching member 44 rotates to effectuate opening and closing motions of the latch mechanism 30.

The cammed plate 36 is rotatable about a central axis 5 I and includes a front face 50 and a back face 52, the front and back faces 50 and 52 being bounded by an outer perimeter 53 and being substantially perpendicular to the central axis 51. The cammed plate 36 can be substantially centered about a rotation plane 58 that is perpendicular to the central axis 51. In one embodiment, the back face 52 is configured with a socket 54 that seats on a mounting boss or mounting projection (not shown) extending from the base portion 29 of the door. The cammed plate 36 can also include structure defining a key hole 37 centered about the central axis 51.

The cammed plate 36 includes structure defining an arcuate camming slot 60 that passes through the front and back faces 50 and 52 of the cammed plate 36. The arcuate camming slot 60 is bound by an inner perimeter 59 that includes an inward cam surface 64 having a width 67 and an outward cam surface 66 having a width 65, the inward and outward cam surfaces 64 and 66 being opposed. In one embodiment, the width 67 of the inward cam surface 64 is wider than the width 65 of the outward cam surface 66.

The arcuate camming slot 60 is centered about an arcuate axis 60.1 that lies on the rotation plane 58. The arcuate camming slot can define a slot width dimension 60.2 that is between the inward cam surface 64 and the outward cam surface 66, the slot width dimension 60.2 being normal to the arcuate axis 60.1 on the rotation plane 58. In one embodiment, the slot width 60.2 is at least 0.25 mm greater than the outer diameter 77 of the engagement portion 80 of the roller 70 and less than or equal to 1.3 times the outer diameter 77 of the engagement portion 80. In other embodiments, the slot width 60.2 is less than or equal to 1.2 times the outer diameter 77 of the engagement portion; in other embodiments, the slot width 60.2 is less than or equal to 1.1 times the outer diameter 77 of the engagement portion.

Figure 10:
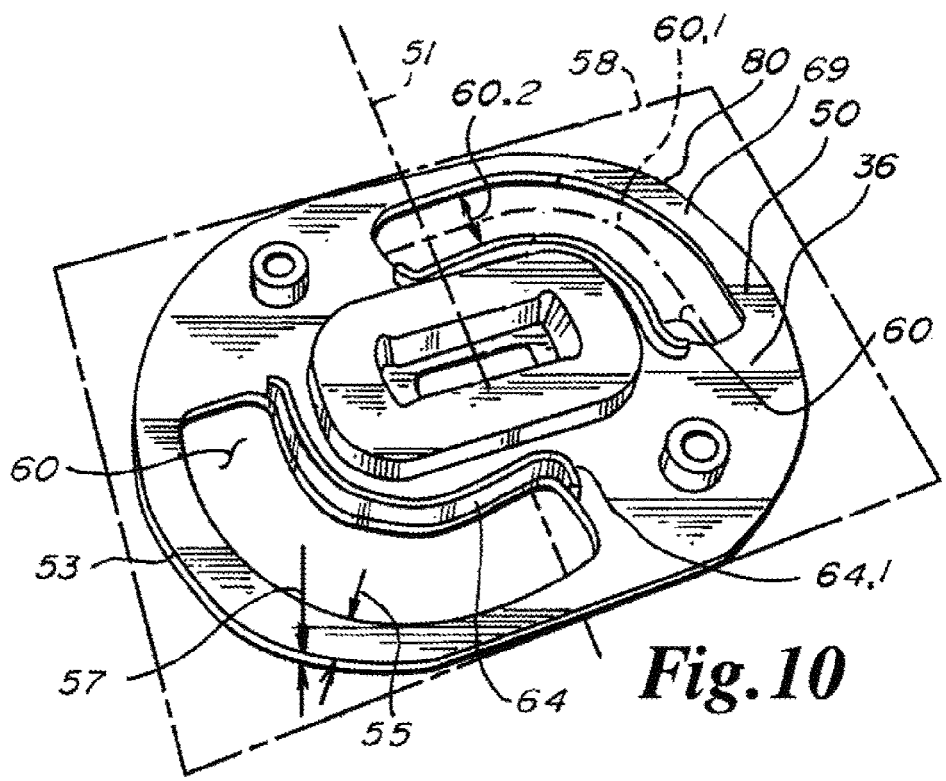
FIG. 10 is a detailed perspective view of a front face of the cammed plate of FIG. 9 in an embodiment of the disclosure.

The arcuate camming slot 60 can be proximate the outer perimeter 53 to define a peripheral portion 69 of the cammed plate 36 located between the arcuate camming slot 60 and the outer perimeter 53. In one embodiment, the peripheral portion 69 includes a radial dimension 55 and a thickness or axial dimension 57 (FIG. 10) that are less than the dimension 83 of the gap 85 of the latch arm 40.

When fully assembled, the cam follower 42 is disposed within the arcuate camming slot 60. The cam follower 42 is mounted to the extensions 87, 88 of the latch arm 40, with the extensions 87, 88 extending over (straddling) the outer perimeter 53 of the cammed plate 36, so that extension 87 is adjacent the front face 50 of the cammed plate 36 and extension 88 is adjacent the back face 52 of the cammed plate 36. In this way, the cam follower 42 is captured within the arcuate camming lot 60.

Figure 11A:
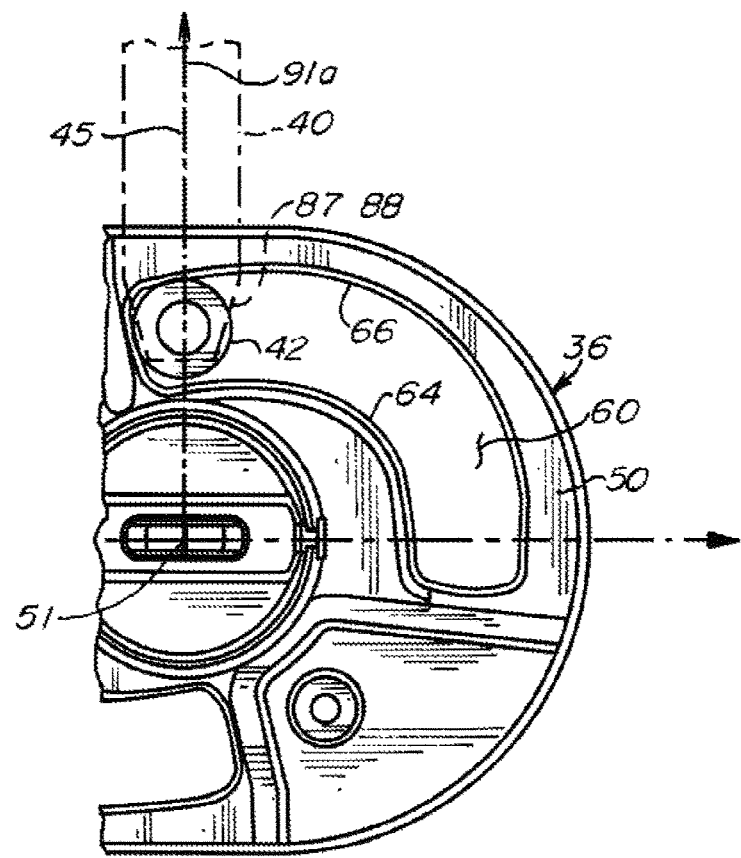
FIGS. 11A through 11D are plan views of the interaction between a cammed plate and a cam follower during operation in an embodiment of the disclosure.
Figure 11B:
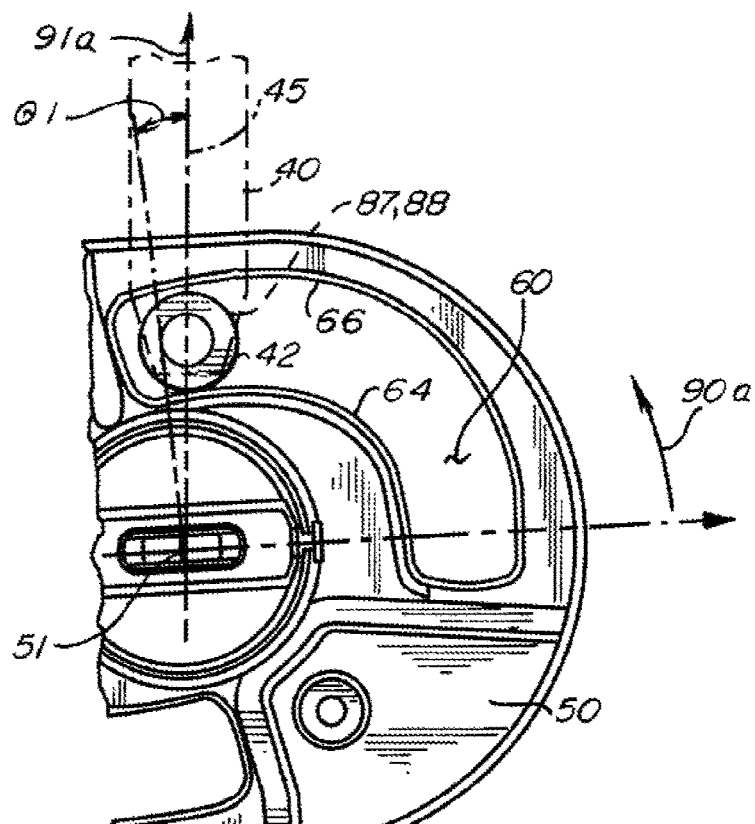
Figure 11C:
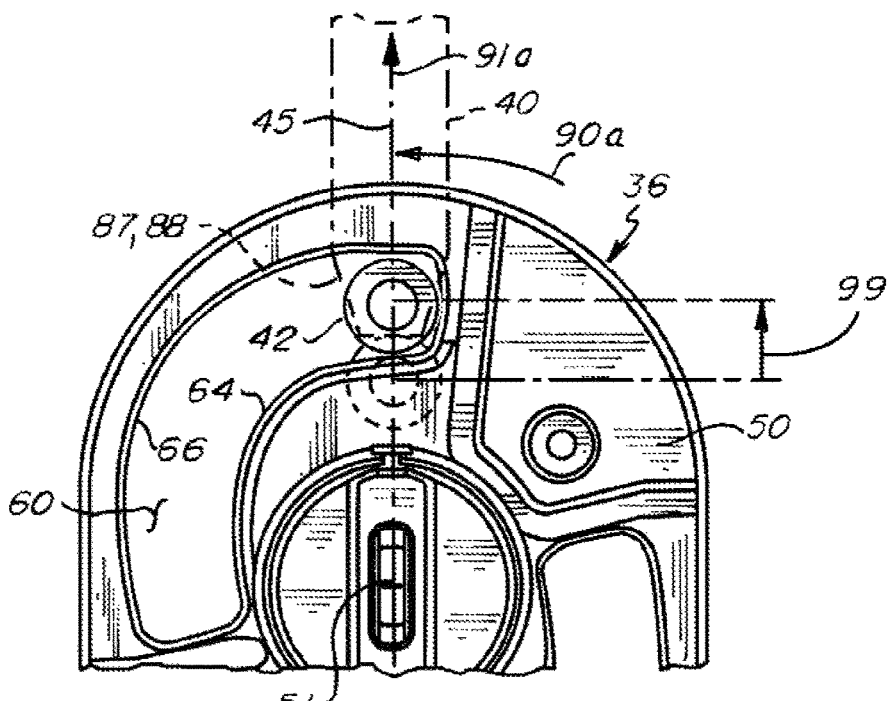
Figure 11D:
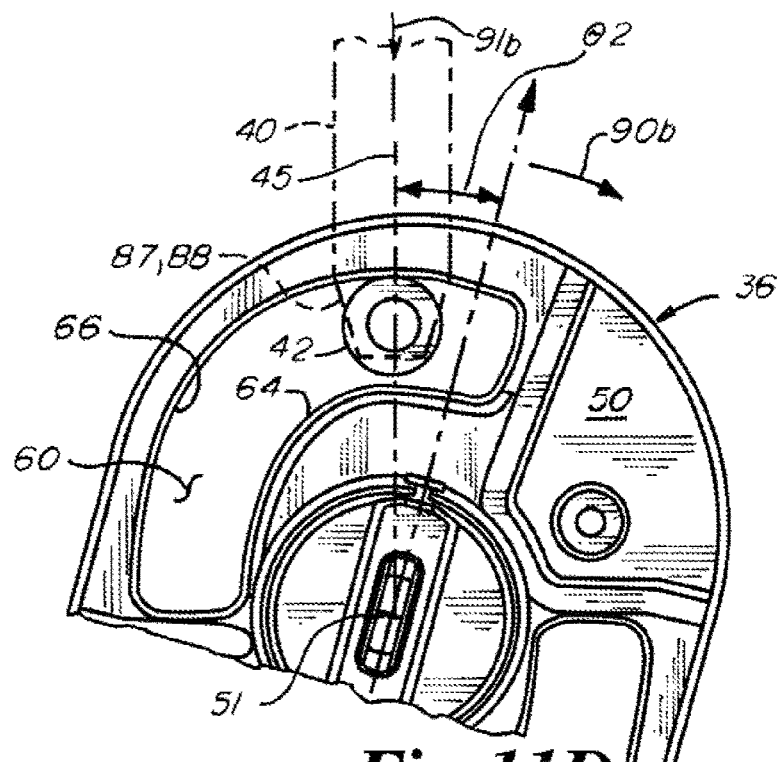

Referring to FIGS. 11A through 11D, interaction between the cammed plate 36 and the cam follower 42 in operation is depicted. In this depiction, the latch mechanism 30 is initially in the open or unlocked configuration, with the cam follower 42 registered against the outward cam surface 66 and the cammed plate 36 rotated to a first rotational extreme (clockwise extreme when viewing the front face 50) (FIG. 11A). When the cammed plate 36 is rotated about the central axis 51 in a first rotational direction 90a (counterclockwise in the FIG. 11 depictions), the inward cam surface 64 rotates towards the cam follower 42, engaging the cam follower 42 after a dead band rotational travel 91 (FIG. 11B). The engagement of the cam follower 42 exerts a force on the extensions 87, 88 of the latch arm 40 (shown in phantom in the FIG. 11 depictions), causing the latch arm 40 to translate in a first translational direction 91a along the actuation axis 45. As the cammed plate 36 continues rotation in the first rotational direction 90a, the inward cam surface continues to rotate towards on the cam follower 42, causing the cam follower 42 to slide or roll with the moving inward cam surface 64 and to exert a force on the latch arm 40 that continues to translate the latch arm 40 in the first translational direction 91a.

The rotation of the cammed plate 36 and attendant translation of the latch arm 40 in the first translational direction 91a continues until the cam follower 42 reaches a second rotational extreme (counterclockwise extreme when viewing the front face 50) (FIG. 1IC). At the second rotational extreme, the cam follower is registered against the inward cam surface 64 and the latch arm 40 is fully extended in the closed or locked position, having been translated a full stroke distance 99. In one embodiment, the rotational distance between the first rotational extreme and the second rotational extreme is approximately 90 degrees. In one embodiment, the full stroke distance 99 is in the range of 8 mm to 15 mm inclusive.

When the cammed plate 36 is rotated about the central axis 51 in a second rotational direction 90b that is opposite the first rotational direction 90a (clockwise in the FIG. 11 depictions), the outward cam surface 66 rotates towards the cam follower 42, engaging the cam follower 42 after a dead band rotational travel 02 {FIG. 1 1D). The engagement of the cam follower 42 exerts a force on the extensions 87, 88 of the latch arm 40, causing the latch arm 40 to translate in a second direction 91b along the actuation axis 45, the second direction 91b being opposite the first translational direction 91a. As the cammed plate 36 continues rotation in the second rotational direction 90b, the outward cam surface 66 continues to rotate towards on the cam follower 42, causing the cam follower 42 to slide or roll with the moving outward cam surface 66 and to exert a force on the latch arm 40 that continues to translate the latch arm 40 in the second direction 91b. The rotation of the cammed plate 36 and attendant translation of the latch arm 40 in the second direction 91b continues until the cam follower 42 reaches the first rotational extreme, as depicted in FIG. IIA. The full cycle of the latch mechanism 30 from fully disengaged to fully engaged and back to fully disengaged is thus completed.

In this way, selective engagement one of the inward and outward cam surfaces 64 or 66 is affected by the direction of the rotation of the cammed plate 36. The cam follower 42 performs a deliberate closed loop route relative to the moving camming slot 60, rather than a fore-and-aft reversal on a curved line. The closed loop route enables the cam follower 42 to engage only one of the cam surfaces 64, 66 at a time, and, when utilized, enables the roller 70 to roll freely within the camming slot 60.

In some embodiments, the dead band rotational travel 8I and 82 is between 2 degrees and 20 degrees inclusive. In other embodiments, the dead band rotational travel $\ominus 1$ and $\ominus 2$ is between 3 degrees and 15 degrees inclusive. In still other embodiments, the dead band rotational travel $\ominus 1$ and $\ominus 2$ is between 5 degrees and 15 degrees inclusive. In yet other embodiments, the dead band rotational travel $\ominus 1$ and $\ominus 2$ is between 7 degrees and 15 degrees inclusive.

Functionally, the inward cam surface 64 facilitates a "pushing" or compression of the latch arm 40 along the actuation axis 45 to effectuate the closing rotation of the latching member 44. The outward cam surface 66 facilitates a "pulling" or tension of the latch arm 40 along the actuation axis 45 to effectuate the opening of the latching member 44. Coupling of the cam follower 42 to the two opposed extensions 87 and 88 provides a symmetrical load on both the latch arm 40 and the cam follower 42 to help maintain alignment therebetween under the forces of operation. The symmetrical load also prevents canting of the cam follower 42 and the attendant moment stresses at the junction of the cam follower 42 and the latching arm 40.

It has been recognized that the force required to actuate the latch mechanism 30 in a door closing action can be significantly higher than the force required to retract the latch mechanism 30 in an opening action. Because of the lower force requirements for retracting the latch mechanism 30, the width 65 of the outward cam surface 66, which drives the cam follower 42 during retraction, can be narrower than the width 67 of the inward cam surface 64. In one embodiment, a ridge 64.1 extends from at least one of the front face 50 and the back face 52 of the cammed plate 36 proximate the camming slot 60 to effect an extension of the inward cam surface 64 in a direction parallel to the central axis 51, thereby providing the wider width 67.

Figure 15:
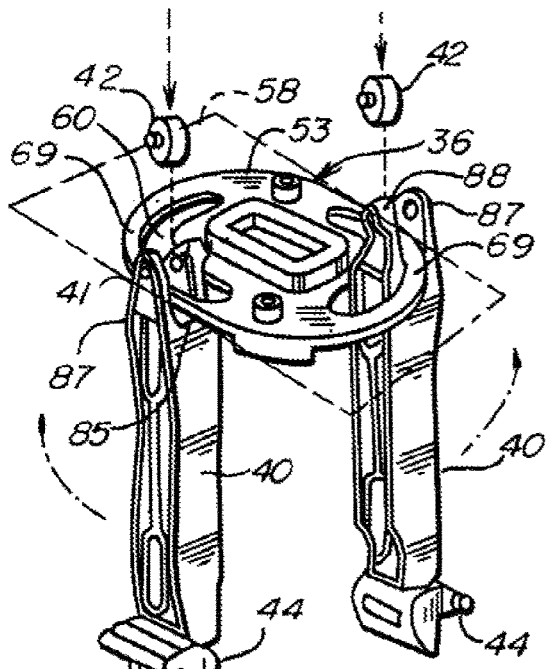
FIG. 15 is a perspective view of an assembly step of a latch mechanism in an embodiment of the disclosure.

Accordingly, in addition to the economies that can be had by using less material on the outward cam surface 66, the diminished material requirements for the outward cam surface 66 enable the peripheral portion 69 of the cammed plate 36 to be dimensioned to facilitate assembly, as described below attendant to FIG. 15.

Referring to FIGS. 12A through 12D, various cross-sectional profiles for the engagement portion 80 of the roller 70 and the cam surfaces 64 and 66 are depicted in embodiments of the disclosure. The engagement portions 80 are referred to individually as engagement portions 80a through 80d and generically or collectively as engagement portion(s) 80. Likewise, the inward and outward cam surfaces 64 and 66 are referred to individually as inward cam surfaces 64a through 64d and outward cam surfaces 66a through 66d, and generically or collectively as cam surface(s) 64 and 66. Also, a "cross-sectional profile" of an engagement portion 80 or an inward or outward cam surface 64 or 66 is defined by the outline of the respective surfaces thereof as viewed in a cross-section in a plane that is normal to a direction of travel of the roller along the cam surface.

Figure 12A:
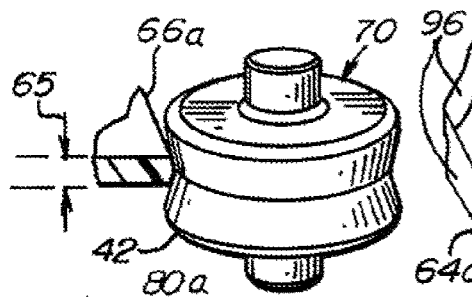
FIG. 12A is a partial cross sectional view of a roller in the slot of a cammed wheel in an embodiment of the disclosure.
Figure 12B:
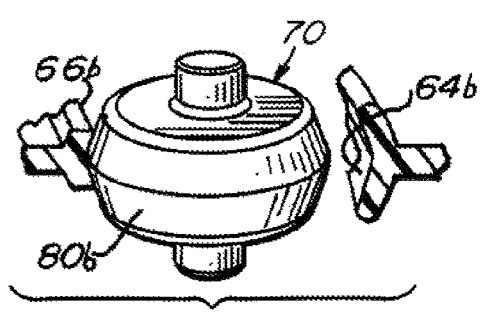
FIG. 12B is a partial cross sectional view of a roller in the slot of a cammed wheel in an embodiment of the disclosure.
Figure 12C:
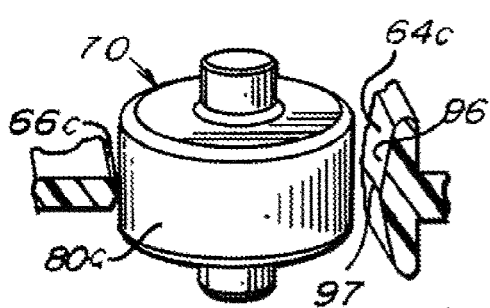
FIG. 12C is a partial cross sectional view of a roller of a cylindrical shape in the slot of a cammed wheel for engaging cam surfaces having a convex surface or a surface with two sub surfaces at an angle of less than 180 degrees in an embodiment of the disclosure.
Figure 12D:
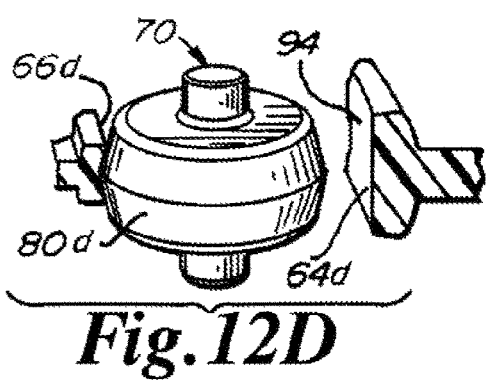
FIG. 12D is a partial cross sectional view of a roller with a maximum diameter in the axial middle of the roller in the slot with of planar cammed surfaces in an embodiment of the disclosure.
Figure 13:
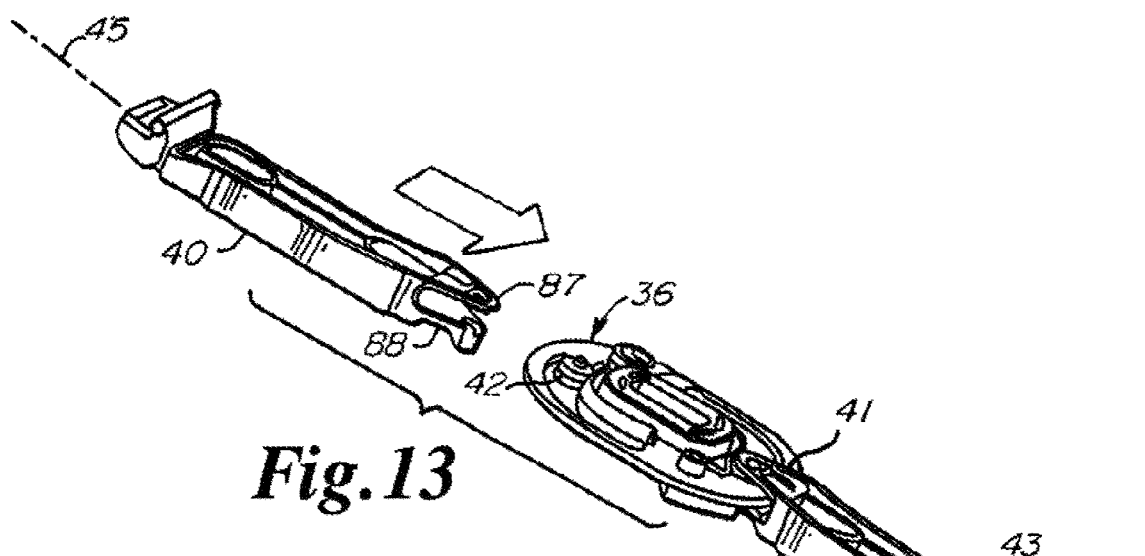
FIG. 13 is a perspective view of assembly step of a latch mechanism in an embodiment of the disclosure.
Figure 14A:
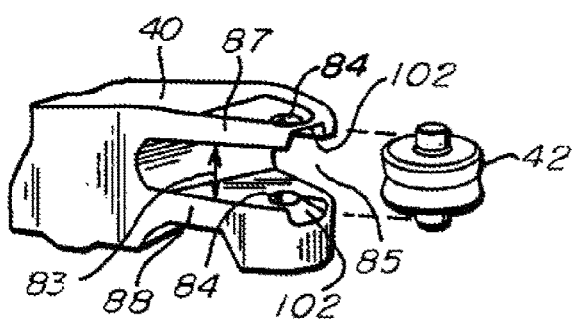
FIG. 14A is a perspective view of an assembly step of a latch mechanism in an embodiment of the disclosure.
Figure 14B:
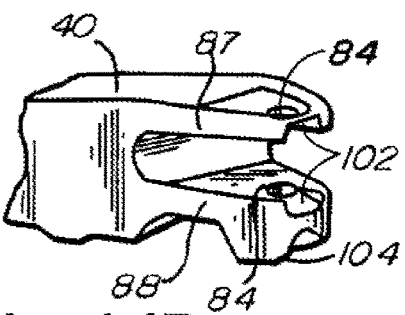
FIG. 14B is a perspective view of proximal ends of a latch arm in an embodiment of the disclosure.

In some embodiments, the engagement portion 80a defines a concave cross-sectional profile while the cooperating inward and outward cam surfaces 64a and 66a define a convex cross-sectional profile (FIG. 12A). In other embodiments, the engagement portion 80b defines a convex cross-sectional profile while the cooperating inward and outward cam surfaces 64b and 66b define a concave cross-sectional profile (FIG. 12B). Thus, the embodiments of FIGS. 12A and 12B present cross-sectional profiles for the engagement portions 80 and the cam surfaces 64 and 66 are that "complementary." In still other embodiments, the engagement portion 80c defines a substantially flat cross-sectional profile while the cooperating inward and outward cam surfaces 64c and 66c define a convex cross-sectional profile (FIG. 12C). In yet another embodiment, the engagement portion 80d defines a convex cross-sectional profile while the cooperating inward and outward cam surfaces 64d and 66d define a substantially flat cross-sectional profile (FIG. 12D). Thus, the embodiments of FIGS. 12C and 12D present cross-sectional profiles for the engagement portions 80 and the cam surfaces 64 and 66 that are "mismatched."

In various embodiments, the convex cross-sectional profiles of the engagement portion 80 and cam surfaces 64 and 66 comprise planar surfaces 96 that are inclined with respect to each other thereby defining an angle therebetween that is less than 180 degrees. In various embodiments, the planar surfaces 96 can intersect to substantially define an apex 97.

Functionally, the complementary profiles of FIGS. 12A and 12B cooperate to provide alignment and tracking forces that influence the roller 70 and the cam surfaces 64 and 66 to stay on track, which can provide more efficient motion translation and reduce the magnitude of the torque required to actuate the latch mechanism 30. On the other hand, we have found that the mismatched profiles can provide favorable life cycles and low torque requirements. The mismatched engagement is believed to be most advantageous from a long lasting robust engagement with abated particle generation when the length of the engaged surfaces of the cross-sectional profiles are at least 0.5 mm and less than 2 mm while under load. In some embodiments, length of the engaged surfaces of the cross-sectional profiles are less than 1.5 mm, in other embodiments less than I mm, and in still other embodiments, less than 0.75 mm. For embodiments utilizing the apex 97, the respective component can be injection molded so that the apex 97 is formed at the parting line of cooperating mold cavities.

Other combinations that mix complementary and mismatched cross-sectional profiles can be configured. For example, the engagement portion 80 can present a convex cross-sectional profile and the outward cam surface 66 present a complementary concave cross-sectional profile (e.g., engagement portion 80a and outward cam surface 66a of FIG. 12A), while the inward cam surface 64 presents a flat cross-sectional profile (e.g., inward cam surface 64d of FIG. 12D). Such an arrangement would provide the advantages of tracking alignment provided by the complementary profiles when the roller is engaged with the narrower outward cam surface 66 (where misalignment between the reduced areas of contact may be of greater concern), while providing the reduced wear advantages provided by the mismatched profiles when the roller is engaged with the wider, inward cam surface 64 during the higher force actuation cycle of the latch mechanism 30.

Referring to FIGS. 13 through 18C, differently configured cam followers 42 and latch arms 40 as well as different modes for assembly of the latch mechanism 30 are illustrated in embodiments of the disclosure. In one embodiment (FIG. 13), an assembly method is to position the cam follower 42 in the arcuate camming slot 60 of the cammed place 36 and to manipulate the extensions 87, 88 or the latch arm 40 over the outer perimeter 53 of the cammed plate 36 to engage and permit the cam follower 42 to snap in to the mounting structures 84 of the extensions 87, 88, thereby capturing the cammed plate 36 between the latch arm 40 and the cam follower 42. Insertion of the cam follower 42 can be done by hand, with tools, or using pneumatics. In some embodiments (FIG. 14A), the mounting structures 84 can include a ramp I 02 to facilitate spreading the extensions 87 and 88 apart in the axial direction (i.e., parallel to the roller axis 74) as the cam follower 42 is snapped into place. In one embodiment (FIG. 148), the ends of one or more of the extensions 87 and/or 88 can be rounded 104 to facilitate rotation of the latch arm 40 for pivoting within the slot 60. In various embodiments (FIG. 15), a method of assembling the latch mechanism 30 includes disposing the peripheral portion 69 of the cammed plate 36 within the gap 85 of the latch arm 40. The latch arm 40 is then oriented so that the mounting structures 84 or the extensions 87, 88 are on the same side of the rotation plane 58. The cam follower 42 is the affixed to the extensions 87 and 88 of the latch arm 40. In one embodiment, the latch arm is fixtured during the assembly. Upon capturing the peripheral portion 69 between the extensions 87, 88 and the cam follower 42, the latch arm 40 can be rotated about the peripheral portion 69 and away from the central axis 51 so that the latch arm 40 is substantially parallel with the rotation plane 58.

Figure 16:
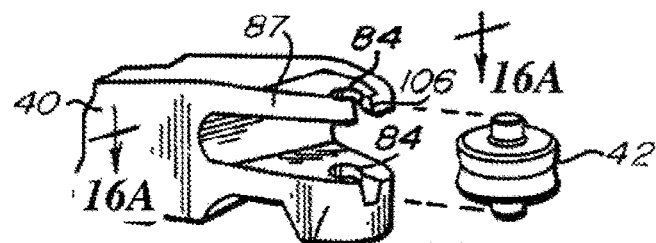
FIG. 16 is a perspective view of an assembly step of a latch mechanism in an embodiment of the disclosure.
Figure 16A:
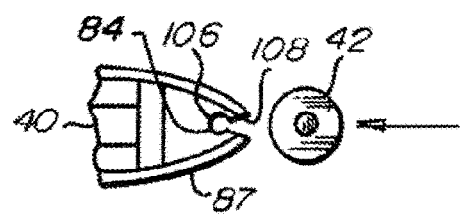
FIG. 16A is a plan view of the assembly step of the latch mechanism of FIG. 16.

In other embodiments (FIGS. 16 and 16A), the mounting structure 84 on at least one of the extensions 87, 88 includes C-shaped snap-in 106 that spreads lateral to the actuation axis when the cam follower 42 is pressed therein. In one embodiment, the C-shaped snap-in includes a lead-in 108 that assist in spreading the C-shaped snap-in 106 in the lateral direction (i.e., perpendicular to the roller axis 74.

Figure 17:
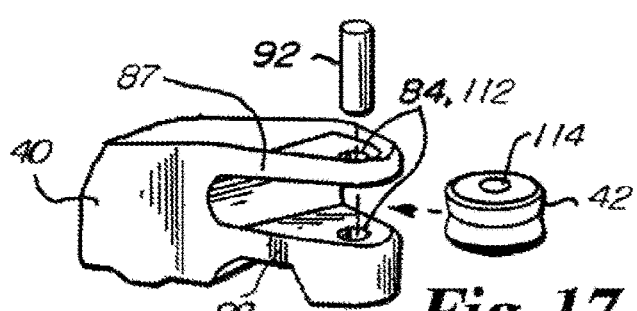
FIG. 17 is a perspective view of an assembly step of a latch mechanism in an embodiment of the disclosure.
Figure 17A:
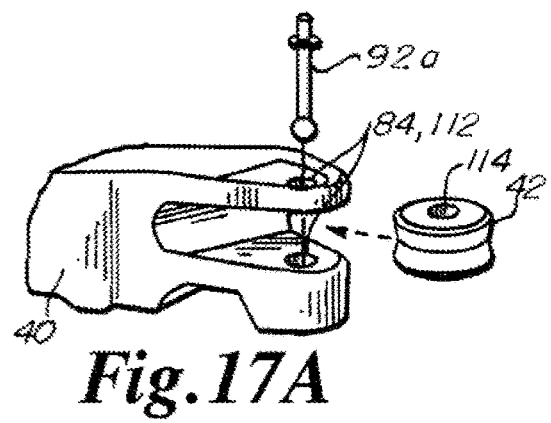
FIG. 17A-17C illustrate alternate attachment techniques of the cam follower in embodiments of the disclosure.
Figure 17B:
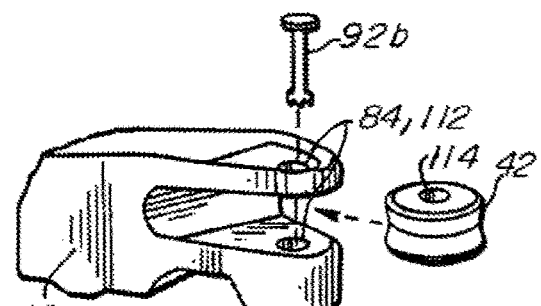
Figure 17C:
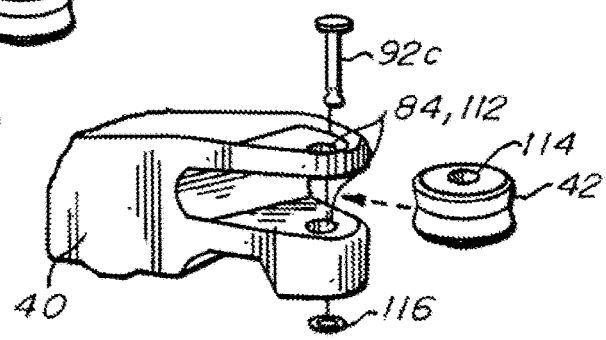

In still other embodiments (FIG. 17), the mounting structures 84 define through-holes 112 through which a pin 92, such as a dowel pin, is inserted. In this embodiment, the cam follower 42 also defines a through-hole 114. The cam follower 42 is placed within the gap 85 between the extensions 87 and 88, and the through-holes 112 and 114 substantially aligned. The pin 92 is then fed through the through-holes 112 and pressed into the cam follower 42 to create the axle 78. Variations of the pin-and-follower arrangement include different structures for the axle 78, including 92a (FIG. 17A), a snap-in plug 92b (FIG. 17B), and a shaft 92c with a C-clip retaining ring 116 (FIG. 17C). Alternatively, the pin 92 can be secured with welded portions, threaded fasteners, or by other fastening techniques available to the artisan.

When the latch arms are attached to the cammed plate, the latching members 44 can also be attached to the distal ends 43 of the latch arms 40. The assembly can then be inserted into the mechanism receiving region 89 of the base portion 29 of the door 24 by manipulating the latching members 44 into their proper seating positions at the periphery of the door 24 and by seating the socket 54 onto the mounting boss or projection on the base portion 29. The over-center biasing spring 46 can then be attached to the cammed plat 36 and the base portion 29 using, for example, polymer screws.

The above references in all sections of this application are herein incorporated by references in their entirety for all purposes.

All of the features disclosed in this specification (including the references incorporated by reference, including any accompanying claims, abstract and drawings), and/or all of the steps of any method or process so disclosed, may be combined in any combination, except combinations where at least some of such features and/or steps are mutually exclusive.

Each feature disclosed in this specification (including references incorporated by reference, any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The claims are not restricted to the details of the foregoing embodiment(s). The claims can extend to any novel one, or any novel combination, of the features disclosed in this specification (including any incorporated by reference references, any accompanying claims, abstract and drawings), or to any novel one, or any novel combination, of the steps of any method or process so disclosed. The above references in all sections of this application are herein incorporated by references in their entirety for all purposes. Although specific examples have been illustrated and described herein, it will be appreciated by those of ordinary skill in the art that any arrangement calculated to achieve the same purpose could be substituted for the specific examples shown. This application is intended to cover adaptations or variations of the present subject matter. Therefore, the above described aspects and embodiments are merely descriptive of its principles and are not to be considered limiting. Further modifications to the embodiments herein disclosed will occur to those skilled in the respective arts, and all such modifications are deemed to be within the scope of the disclosure.

References to "embodiment(s)", "disclosure", "present disclosure", "embodiment(s) of the disclosure", "disclosed embodiment(s)", and the like contained herein refer to the specification (text, including the claims, and figures) of this patent application that are not admitted prior art.

For purposes of interpreting the claims, it is expressly intended that the provisions of Section 112, sixth paragraph of 35 U.S.C. are not to be invoked unless the specific terms "means for" or "step for" are recited in a claim.

What is claimed is:

1. A door latching mechanism for a wafer container, comprising:
    a cammed plate having a central axis and comprising a camming slot having an outer perimeter and defining a cam surface;
    a latch arm translatable along an actuation axis and including a proximal end having a first extension and a second extension, the first extension and said second extension extending over said outer perimeter of the cammed plate; and
    a cam follower disposed within said camming slot and wherein the cam follower has opposing axial ends with one axial end coupled to the first extension and the other axial end coupled to the second extension of the latch arm to stabilize the cam follower in the latch arm, wherein said cam follower comprises a roller having an engagement portion for engaging the cam surface, the roller being rotatable about a rotational axis that substantially parallel to the central axis of the cammed plate.

2. The door latching mechanism of claim 1, wherein the engagement portion of the roller defines one of a convex cross-sectional profile and a concave cross-sectional profile, the cross-sectional profile of the roller being complementary to a cross-sectional profile of the cam surface.

3. The door latching mechanism of claim 1, wherein the engagement portion of the roller defines a flat cross sectional profile.

4. The door latching mechanism of claim 1, wherein the engagement portion of the roller defines one of a convex cross-sectional profile and a concave cross-sectional profile, the cross-sectional profile of the roller being mis-matched to a cross-sectional profile of the cam surface.

5. The door latching mechanism of claim 1, wherein the engagement portion of the roller defines convex cross-sectional profile having planar surfaces that are inclined with respect to each other and that intersect to define an apex.

6. The door latching mechanism of claim 1, wherein the roller is rotatable about an axle having opposing axial ends.

7. The door latching mechanism of claim 6, wherein an outer diameter of the engagement portion of the roller is at least two times greater and less than or equal to five times greater than the axle diameter.

8. The door latching mechanism of claim 6, wherein the axle is in the range of 20% to 40% inclusive of the outer diameter of the engagement portion.

9. The door latching mechanism of claim 6, wherein the axle is integrally formed with said roller.

10. The door latching mechanism of claim 6, wherein the axle is selected from a group consisting of a dowel pin, a rivet, a snap-in plug, and a shaft with retaining ring.

11. The door latching mechanism of claim 1, wherein the first extension and the second extension each include a mounting structure for engagement with the opposing axial ends of the cam follower.

\* \* \* \* \*